United States Patent
Park et al.

(10) Patent No.: US 11,997,810 B2
(45) Date of Patent: May 28, 2024

(54) DISPLAY DEVICE INCLUDING A BONDING MEMBER

(71) Applicant: SAMSUNG DISPLAY CO., LTD., Yongin-si (KR)

(72) Inventors: Jun Su Park, Seoul (KR); Gi Suk Kwon, Cheonan-si (KR); Young Gil Park, Asan-si (KR); Na Ri Ahn, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 443 days.

(21) Appl. No.: 16/986,498

(22) Filed: Aug. 6, 2020

(65) Prior Publication Data
US 2021/0195778 A1 Jun. 24, 2021

(30) Foreign Application Priority Data
Dec. 20, 2019 (KR) .......................... 10-2019-0171831

(51) Int. Cl.
*H05K 5/03* (2006.01)
*B32B 3/02* (2006.01)
(Continued)

(52) U.S. Cl.
CPC ................. *H05K 5/03* (2013.01); *B32B 3/02* (2013.01); *B32B 7/12* (2013.01); *H05K 5/0017* (2013.01);
(Continued)

(58) Field of Classification Search
CPC .......... H05K 5/03; H05K 5/0017; B32B 3/02; B32B 7/12; B32B 2307/42;
(Continued)

(56) References Cited

U.S. PATENT DOCUMENTS

| | | | |
|---|---|---|---|
| 2014/0139984 A1* | 5/2014 | Jung | ...................... G06F 1/1656 361/679.01 |
| 2016/0011689 A1* | 1/2016 | Kim | ...................... G06F 3/0443 345/173 |

(Continued)

FOREIGN PATENT DOCUMENTS

| | | |
|---|---|---|
| JP | 2016-108363 | 6/2016 |
| KR | 10-0547279 | 1/2006 |

(Continued)

OTHER PUBLICATIONS

Okuni, Jun. 2015, English Translation of JP-2015106045-A (Year: 2015).*
Noda, Jun. 2006, English Translation of JP-2006162793-A (Year: 2006).*

*Primary Examiner* — Nathan L Van Sell
(74) *Attorney, Agent, or Firm* — F. Chau & Associates, LLC

(57) ABSTRACT

A display device including: a display panel; a polarizing member overlapping the display panel; a cover window overlapping the polarizing member; and a window bonding member disposed between the polarizing member and the cover window, wherein a penetration depth of the window bonding member that is measured by an indentation tester is equal to or less than approximately 13 μm.

17 Claims, 13 Drawing Sheets

(51) Int. Cl.
*B32B 7/12* (2006.01)
*H05K 5/00* (2006.01)
*H10K 50/84* (2023.01)

(52) U.S. Cl.
CPC .......... *H10K 50/84* (2023.02); *B32B 2307/42* (2013.01); *B32B 2457/208* (2013.01)

(58) Field of Classification Search
CPC .......... B32B 2457/208; H01L 51/5237; H01L 51/524; H01L 51/5281; H01L 51/52; H01L 27/32; H01L 51/5246; G02B 5/3033; G02B 5/30; H04M 1/0266; G09F 9/00
See application file for complete search history.

(56) References Cited

U.S. PATENT DOCUMENTS

2018/0145124 A1* 5/2018 Kim .................... H01L 27/3248
2018/0290436 A1* 10/2018 Yui ................... B32B 17/10587

FOREIGN PATENT DOCUMENTS

| KR | 10-2017-0048440 | 5/2017 |
| KR | 10-2017-0080245 | 7/2017 |
| KR | 10-2018-0093655 | 8/2018 |
| KR | 10-2018-0099210 | 9/2018 |
| KR | 10-1905245 | 10/2018 |

* cited by examiner

FIG.7

| ITEMS | | MEASUREMENT CONDITIONS |
|---|---|---|
| INSTRUMENT | | Anton Paar UNHT-BIO |
| | Tip | Ruby ball R=500um |
| | LOAD | 0.5mN |
| | Load/unloading rate | 3mN/min |
| | Holding time | 120sec |
| | Poisson's Ratio | 0.3 |
| | Kelvin-Voigt model Element count | 2 |

DISPLAY DEVICE INCLUDING A BONDING MEMBER

This application claims priority under 35 U.S.C. § 119 to Korean Patent Application No. 10-2019-0171831 filed on Dec. 20, 2019 in the Korean Intellectual Property Office, the disclosure of which is incorporated by reference herein in its entirety.

1. TECHNICAL FIELD

The present invention relates to a display device, and more particularly, to a display device including a bonding member.

2. DESCRIPTION OF THE RELATED ART

A display device is an output device for presentation of information in visual form, for example, a display device may provide images to a user. Electronic devices that employ a display device include a smart phone, a tablet personal computer (PC), a digital camera, a laptop computer, a navigation device and a smart television (TV), among others.

Recently, a curved display device having at least one curved edge has been developed. Images are displayed on the curved edge of the curved display device, so that a viewer can see a wider screen. The curved edge itself is also aesthetically pleasing.

A curved display device may include a window bonding member attaching a polarizing member on a display panel to a cover window. The modulus of the window bonding member in the flat area of the curved display device may, however, be different from that in curved areas of the curved display device.

SUMMARY

According to an exemplary embodiment of the present invention, a display device includes: a display panel; a polarizing member overlapping the display panel; a cover window overlapping the polarizing member; and a window bonding member disposed between the polarizing member and the cover window, wherein a penetration depth of the window bonding member that is measured by an indentation tester is equal to or less than approximately 13 μm.

The penetration depth may be measured by the indentation tester by pressing an indenter against the window bonding member, holding the indenter with a predetermined load for a predetermined period of time, and then unloading the indenter.

The indenter may have at least a partial ball shape.

A modulus of the window bonding member may be equal to or greater than approximately 0.61 MPa, and creep properties of the window bonding member may be approximately 70%.

The window bonding member may be a thin film having a thickness of 0.05 mm to 1 mm, and the modulus and the creep properties of the window bonding member may be measured from the thin film.

The modulus and the creep properties of the window bonding member may be measured from the window bonding member separated from the display device by using the indentation tester.

The display device may include a flat area, a first curved area located on a first side of the flat area, and a second curved area located on a second side of the flat area, the display device may further include a light-blocking pattern disposed directly on a surface of the cover window that faces the window bonding member, and the light-blocking pattern may be disposed in the first curved area and the second curved area.

The window bonding member may include a first portion disposed in the flat area, and second portions disposed in the first curved area and the second curved area, and a penetration depth of the first portion measured by the indentation tester may be smaller than a penetration depth of each of the second portions that are measured by the indentation tester.

A modulus of the first portion may be greater than a modulus of each of the second portions, and creep properties of the first portion may be smaller than creep properties of each of the second portions.

The window bonding member may be ultraviolet ray (UV) cured.

The window bonding member may be disposed between the polarizing member and the cover window and then UV cured.

According to another exemplary embodiment of the present invention, a display device includes a flat area, a first curved area located on a first side of the flat area and a second curved area located on a second side of the flat area, wherein the display device includes: a display panel; a polarizing member overlapping the display panel; a cover window overlapping the polarizing member; and a window bonding member disposed between the polarizing member and the cover window, and wherein a modulus of the window bonding member is equal to or greater than approximately 0.61 MPa.

The window bonding member may include a first portion disposed on the flat area, and second portions disposed on the first curved area and the second curved area, and a modulus of the first portion may be larger than a modulus of each of the second portions.

Creep properties of the window bonding member may be approximately 70%, and creep properties of the first portion may be smaller than creep properties of each of the second portions.

A penetration depth of the window bonding member measured by an indentation tester may be equal to or less than 13 μm, and a penetration depth of the first portion may be smaller than a penetration depth of each of the second portions.

The window bonding member may be a thin film having a thickness of 0.05 mm to 1 mm, and the modulus of the window bonding member and the creep properties of the window bonding member may be measured from the thin film.

The modulus of the window bonding member and the creep properties of the window bonding member may be measured from the window bonding member separated from the display device by using the indentation tester.

According to yet another exemplary embodiment of the present invention, a display device includes a flat area, a first curved area located on a first side of the flat area and a second curved area located on a second side of the flat area, wherein the display device includes: a display panel; a polarizing member disposed on the display panel; a cover window disposed on the polarizing member; and a window bonding member disposed between the polarizing member and the cover window, wherein the window bonding member comprises a first portion disposed on the flat area and second portions disposed on the first curved area and the second curved area, and wherein a modulus of the first portion is equal to or greater than approximately 0.61 MPa and a modulus of each of the second portions is equal to or greater than approximately 0.61 MPa.

Creep properties of the first portion are approximately 70% and creep deformation characteristics of each of the second portions are approximately 70%, and the creep properties of the first portion are smaller than the creep properties of each of the second portions.

A penetration depth of the first portion may be equal to or less than approximately 13 µm and a penetration depth of each of the second portions may be equal to or less than approximately 13 µm, wherein the penetration depths of the first portion and the second portions are measured by an indentation tester, and the penetration depth of the first portion may be smaller than the penetration depth of each of the second portions.

BRIEF DESCRIPTION OF THE DRAWINGS

The above and other features of the present invention will become more apparent by describing in detail exemplary embodiments thereof with reference to the attached drawings, in which:

FIG. 7 is a table showing measurement conditions for a Bio-indenter according to an exemplary embodiment of the present invention.

DETAILED DESCRIPTION OF THE EMBODIMENTS

Figure 1:
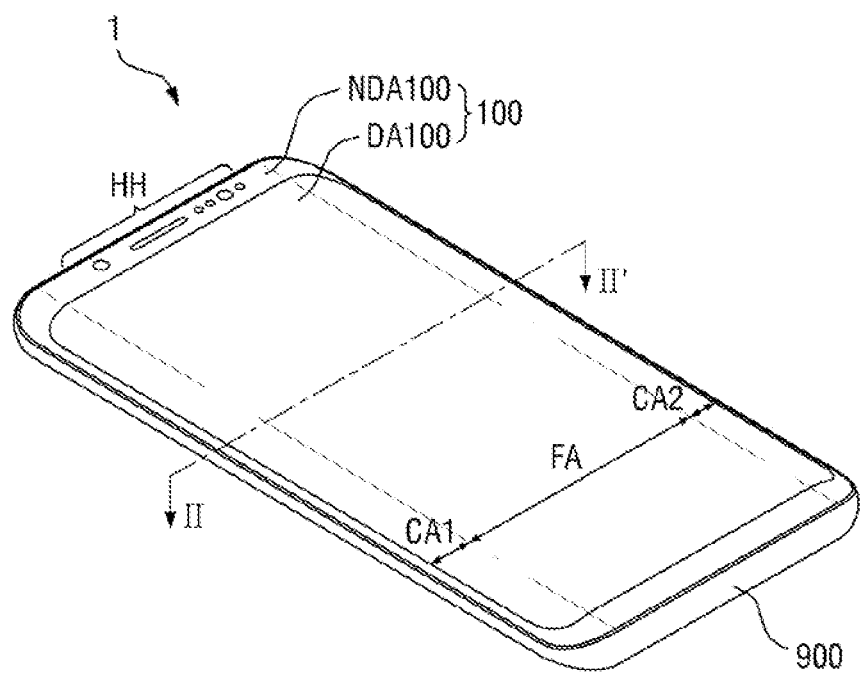
FIG. 1 is a perspective view of a display device according to an exemplary embodiment of the present invention.

Specific structural and functional descriptions of exemplary embodiments of the present invention disclosed herein are for illustrative purposes. The present invention may be embodied in many different forms, and thus, the present invention is not limited to the embodiments disclosed herein.

It will be understood that when an element is referred to as being related to another element such as being "coupled" or "connected" to another element, it can be directly coupled or connected to the other element or intervening elements may be present therebetween. Other expressions that explain the relationship between elements, such as "between," "directly between," "adjacent to," or "directly adjacent to," may be construed in a similar fashion.

Throughout the specification, the same reference numerals may refer to the same or like parts.

As used herein, "a", "an," "the," and "at least one" and are intended to include both the singular and plural, unless the context clearly indicates otherwise.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein may be inclusive of the stated value and may mean within an acceptable range of deviation for the particular value as determined by one of ordinary skill in the art, considering the measurement in question and the error associated with measurement of the particular quantity (e.g., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but may include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to limit the scope of the present invention.

Hereinafter, exemplary embodiments of the present invention will be described with reference to the attached drawings.

Figure 2:
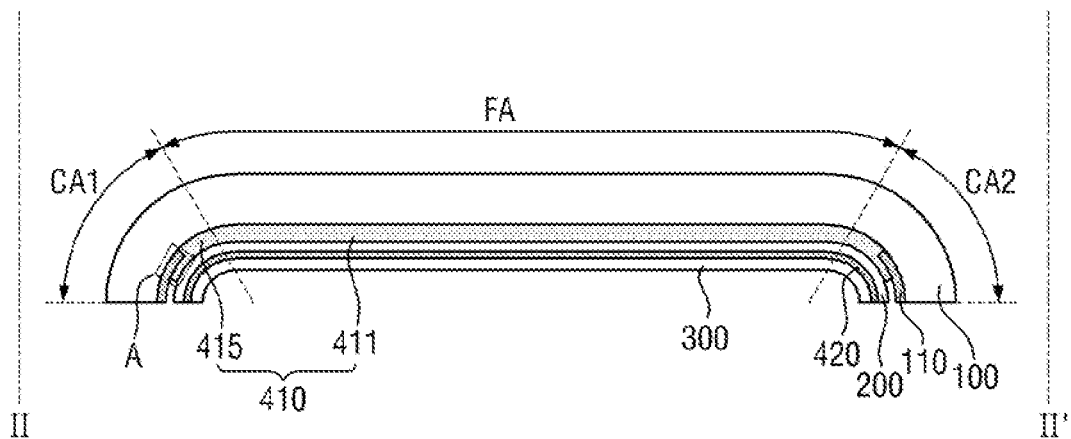
FIG. 2 is a cross-sectional view taken along line II-II' of FIG. 1.
Figure 3:
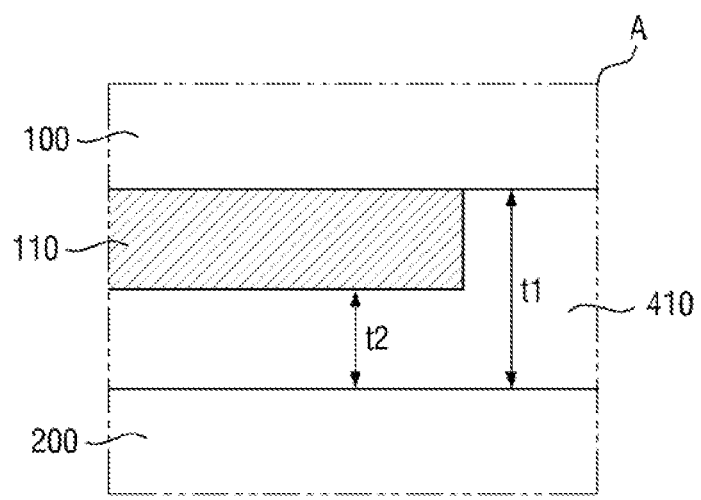
FIG. 3 is an enlarged cross-sectional view of area A of FIG. 2.

FIG. 1 is a perspective view of a display device according to an exemplary embodiment of the present invention. FIG. 2 is a cross-sectional view taken along line II-II' of FIG. 1. FIG. 3 is an enlarged cross-sectional view of area A of FIG. 2;

Referring to FIGS. 1 to 3, a display device 1 according to an exemplary embodiment of the present invention includes a cover window 100, a polarizing member 200, a display panel 300 and a bottom cover 900.

As used herein, the terms "above," "top" and "upper surface" may refer to the side of the display panel 300 in the z-axis direction where the window 100 is disposed, whereas the terms "below," "bottom" and "lower surface" may refer to the opposite side of the display panel 300 in the z-axis direction where the bottom cover 900 is disposed. As used herein, the terms "left," "right," "upper" and "lower" sides indicate relative positions when the display panel 300 is viewed from the top. For example, the "left side" may refer to the opposite side indicated by the arrow of the x-axis direction, the "right side" may refer to the side indicated by the arrow of the x-axis direction, the "upper side" may refer to the direction indicated by the arrow of the y-axis direction, and the "lower side" may refer to the opposite side indicated by the arrow of the y-axis direction.

The display device 1 may have a rectangular shape when viewed from the top. For example, the display device 1 may have a rectangular shape having shorter sides in a first direction (x-axis direction) and longer sides in a second direction (y-axis direction) when viewed from the top as shown in FIG. 1. Each of the corners where the short side in the first direction (x-axis direction) meets the longer side in the second direction (y-axis direction) may be rounded with a predetermined curvature or may have a right angle. The shape of the display device 1 when viewed from the top is not limited to a rectangular shape, but may have another polygonal shape, circular shape, or elliptical shape.

The display device 1 may include a first area that is flat and second areas that are extended from the left and right sides of the first area. The second areas may be flat or curved. When the second areas are flat, the angle formed by the first area and each of the second areas may be obtuse. When the second areas are curved surfaces, they may have a constant curvature or varying curvatures. In the display device 1 according to the present embodiment, the first area may be a flat area FA, and the second areas may be curved areas CA1 and CA2 that are extended from the left and right sides of the first area and are bent in the thickness direction (z-axis direction). For example, the curved areas CA1 and CA2 may be bent downward. The first curved area CA1 may be located on one side (left side) of the flat area FA in the first direction (x-axis direction), and the second curved area CA2 may be located on the other side (right side) of the flat area FA in the first direction (x-axis direction).

Although the second areas are extended from the left and right sides of the first area, respectively, in FIG. 1, this is merely illustrative. For example, the second areas may be extended from only one of the right and left sides of the first area.

Alternatively, the second areas may be extended from at least one of upper and lower sides of the first area, as well as the left and right sides. More detailed description thereon will be made below with reference to FIG. 13. In the following description, the second areas are disposed at the left and right edges of the display device 1, respectively.

The cover window 100 may be disposed on the polarizing member 200 and the display panel 300 to cover them. Accordingly, the cover window 100 can protect the upper surfaces of the polarizing member 200 and the display panel 300. The cover window 100 may be attached to the polarizing member 200 through a window bonding member 410 as shown in FIG. 2.

The cover window 100 may include a transmissive area DA100 corresponding to the display panel 300 and a non-transmissive area NDA100 corresponding to the other area than the display panel 300. The transmissive area DA100 may be a display area and the non-transmissive area NDA100 may be a non-display area. The cover window 100 may be disposed on the flat area FA and the curved portions CA1 and CA2. The transmissive area DA100 may be disposed on a part of the flat area FA and a part of the curved areas CA1 and CA2. The non-transmissive area NDA 100 may be opaque. Alternatively, the non-transmissive area NDA 100 may be a decorative layer having a pattern that can be displayed to a user when no image is displayed. For example, a company's logo such as "SAMSUNG" or various letters may be patterned in the non-transmissive area NDA100. Holes HH for exposing a front camera, a front speaker, an infrared sensor, an iris recognition sensor, an ultrasonic sensor, an illuminance sensor, etc. may be formed in the non-transmissive area NDA100. However, some or all of the front camera, the front speaker, the infrared sensor, the iris recognition sensor, the ultrasonic sensor and the illuminance sensor may be incorporated into the display panel 300. In this case, some or all of the holes HH may be removed. A light-blocking pattern 110 may be disposed on the surface of the cover window 100 and face the polarizing member 200 and the display panel 300 in the curved areas CA1 and CA2. The light-blocking pattern 110 may not be disposed on the whole surface in the curved areas CA1 and CA2. For example, the light-blocking pattern 110 may be disposed from the ends of the cover window 100 in the cured areas CA1 and CA2 and extended close to the boundary between the curved areas CA1 and CA2 and the flat area FA.

The cover window 100 may be made of glass, sapphire and/or plastic. The cover window 100 may be rigid or flexible.

The polarizing member 200 and the display panel 300 may be disposed in the flat area FA and the curved areas CA1 and CA2. The cover window 100 may be disposed on the outer side of the polarizing member 200 and the display panel 300 to completely cover them.

The window bonding member 410 may be disposed in the flat area FA and a part of the curved areas CA1 and CA2.

The window bonding member 410 may be indented inwardly from the cover window 100 and the polarizing member 200. In other words, the window bonding member 410 may expose the surface of the polarizing member 200 facing the cover window 100 in the curved areas CA1 and CA2. For example, as shown in FIG. 2, a space may be formed between the polarizing member 200 and the light-blocking pattern 110. It is, however, to be understood that the present invention is not limited thereto. The window bonding member 410 may not expose the surface of the polarizing member 200 facing the cover window 100 but may completely cover the surface of the polarizing member 200 facing the cover window 100 in the curved areas CA1 and CA2. The window bonding member 410 may be optically transparent.

The display panel 300 displays images and may include a self-luminous display panel such as an organic light-emitting display panel (OLED), an inorganic light-emitting display panel (inorganic EL), a quantum-dot light-emitting display panel (QED), a micro LED display panel (micro-LED), a nano LED display panel (nano-LED), a plasma display panel (PDP), a field emission display panel (FED) and a cathode ray display panel (CRT), as well as a light-receiving display panel such as a liquid-crystal display panel (LCD) and an electrophoretic display panel (EPD). In the following description, the OLED will be described as an example of the display panel 300, and the OLED will be simply referred to as the display panel 300 unless specifically stated otherwise. It is, however, to be understood that the present invention is not limited to the OLED, and any other display panel listed above or other not listed display panel may be employed in conjunction with the present invention.

The display panel 300 may further include a touch member. The touch member may be a panel or film separated from the display panel 300 to be attached on the display panel 300 or may be a touch layer inside the display panel 300. Although the touch member is provided inside the display panel 300 to be included in the display panel 300 in the following description, it is to be understood that the present invention is not limited thereto.

The display panel 300 may include a substrate, a circuit driving layer on the substrate, an emission layer on the circuit driving layer, an encapsulation layer on the emission layer, and a touch layer on the encapsulation layer.

The substrate may be a flexible substrate including a flexible polymer material such as polyimide. Accordingly, the display panel 300 may be curved, bent, folded, or rolled. In some exemplary embodiments of the present invention, the substrate may include a plurality of sub-substrates overlapping in the thickness direction with a barrier layer therebetween. In such case, each of the sub-substrates may be a flexible substrate.

The circuit driving layer may be disposed on the substrate. The circuit driving layer may include a circuit for driving the emission layer of a pixel. The circuit driving layer may include a plurality of thin-film transistors.

The emission layer may be disposed on the circuit driving layer. The emission layer may include an organic emission layer. The emission layer may emit light at different luminance levels according to a driving signal transmitted from the circuit driving layer.

The encapsulation layer may be disposed on the emission layer. The encapsulation layer may include an inorganic layer or a stack of an inorganic layer and an organic layer.

The touch layer may be disposed on the encapsulation layer. The touch layer may sense a touch input and may perform the functions of the touch member. The touch layer may include a plurality of sensing regions and sensing electrodes.

The polarizing member 200 polarizes the light passing therethrough. The polarizing member 200 can reduce the reflection of external light. In an exemplary embodiment of the present invention, the polarizing member 200 may be a polarizing film. The polarizing film may include protective substrates and a polarizing layer sandwiched between the protective substrates. The polarizing layer may include a polyvinyl alcohol film. The polarizing layer may be stretched in a particular direction. The direction in which the polarizing layer is stretched may be an absorption axis, while the direction perpendicular thereto may be a transmission axis. The protective substrates may be disposed on one side and the other side of the polarizing layer, respectively. The protective substrates may be made of, but are not limited to, a cellulose resin such as triacetyl cellulose, a polyester resin, etc.

As shown in FIG. 2, a polarization bonding member 420 may be further disposed between the polarizing member 200 and the display panel 300. The polarization bonding member 420 may couple the polarizing member 200 with the display panel 300. The polarization bonding member 420 may be optically transparent like the window bonding member 410. The polarization bonding member 420 may directly contact the polarizing member 200 and the display panel 300.

The window bonding member 410 according to the present embodiment may include a first portion 411 disposed on the flat area FA, and second portions 415 disposed on the curved areas CA1 and CA2. The second portions 415 of the window bonding member 410 may overlap the light-blocking pattern 110 described above.

The window bonding member 410 and the polarization bonding member 420 may each include an adhesive material. Each of the bonding members 410 and 420 may include a pressure-sensitive adhesive layer.

The bonding members 410 and/or 420 may include an optically-transparent, adhesive layer or an optically transparent resin.

As shown in FIG. 3, the second portions 415 of the window bonding member 410 may be partially overlapped with the light-blocking pattern 110. The part of the second portions 415 that does not overlap with the light-blocking pattern 110 may have a first thickness t1, while the part of the second portions 415 that overlaps with the light-blocking pattern 110 may have a second thickness t2. The first thickness t1 may be greater than the second thickness t2. The first portion 411 may have the thickness equal to the first thickness t1 of the second portions 415 and may be disposed in the flat area FA.

The first thickness t1 of the window bonding member 410 may be approximately 1 mm or less. According to an exemplary embodiment of the present invention, the first thickness t1 of the window bonding member 410 may be approximately 0.05 to 1 mm. Although the lower limit of the thickness of the window bonding member 410 is not particularly limited, it may be approximately 10 μm or more to achieve the minimum adhesive force, and more specifically, approximately 50 μm or more.

The window bonding member 410 may include a single adhesive layer or may include multiple adhesive layers stacked on one another, and may include an adhesive layer on each of the sides of the substrate, like a double-sided tape.

In some exemplary embodiments of the present invention, the window bonding member 410 may include a silicone-based adhesive. The silicone-based adhesive may include a siloxane resin. For example, the silicone-based adhesive may include a silicone gum containing a polyorganosiloxane compound. The silicone gum may include a crosslinkable functional group such as a vinyl group. The silicone-based adhesive may further include an MQ resin having a three-dimensional molecular structure in the form of a three-dimensional network including a monofunctional siloxane unit and a tetrafunctional siloxane unit. The silicone-based adhesive may further include an additive including at least one of a borane compound and a borate compound.

In some exemplary embodiments of the present invention, the window bonding member 410 may include an acrylic adhesive. The acrylic adhesive may include an acrylic polymer. The acrylic polymer is a polymerized acrylic monomer, and may be the main material of the acrylic polymer. The acrylic monomer may include ethyl acrylate, n-butyl acrylate, t-butyl acrylate, isobutyl acrylate, n-hexyl acrylate, 2-ethylhexyl acrylate, n-octyl acrylate, isooctyl acrylate, n-nonyl acrylate, isononyl acrylate, n-decyl acrylate, isodecyl acrylate, n-dodecyl acrylate, n-tridecyl acrylate, n-tetradecyl acrylate, 2(2-ethoxyethoxy) ethyl acrylate, 2-hydroxyethyl acrylate, 2-hydroxypropyl acrylate, 3-hydroxypropyl acrylate, 2-hydroxy butyl acrylate, 4-hydroxy butyl acrylate, 6-hydroxyhexyl acrylate, 8-hydroxyoctyl acrylate, 10-hydroxydecyl acrylate, 12-hydroxy lauryl acrylate, [4-(hydroxymethyl)cyclohexyl]methyl acrylate, etc. In addition to the acrylic polymer, the acrylic adhesives may include azo initiators such as 2,2'-azo-bis-isobutyronitrile, a filler such as silica and zirconia, a crosslinking agent, and an antistatic agent such PEDOT:PSS (poly(3,4-ethylenedioxythiophene) polystyrene sulfonate). According to an exemplary embodiment of the present invention, the acrylic adhesive may be produced by mixing 120 to 250 parts by weight of the above-described acrylic monomer with a solvent and heating it while stirring, and then adding 0.1 to 1 parts by weight of the azo initiator, 0.5 to 1 parts by weight of the filler, 1.5 to 2.5 parts by weight of the crosslinking agent and 0.5 to 1 parts by weight of the antistatic agent to the solution and heating it while stirring.

In some exemplary embodiments of the present invention, the window bonding member 410 may include a crystalline polymer and a rubber-based polymer. The crystalline polymer may be polypropylene, syndiotactic polystyrene, polyamide, polycaprolactone, polycarbonate-diol, polyethylene terephthalate (PET), polyphenylene sulfide, polybutylene terephthalate (PBT), polyarylate (PAR), poly(DPAA), polyether imide (PEI), polyacetal, polyoxymethylene (POM), etc.

The rubber-based polymer may be polybutadiene, polyisoprene, poly neoprene, polyisobutylene, cellulose acetate, polyvinyl acetate or a copolymer thereof. The weight ratio of the crystalline polymer and the rubber polymer may range from 1:0.3 to 1:1.5. In addition, the window bonding member 410 may further include a carbamic acid ester polymer, an ester polymer and/or a (meth)acrylic acid ester polymer, and may further include a coupling agent such as a silane coupling agent, a titanate coupling agent and a chromium coupling agent, an adhesion promoter such as a rosin resin, a rosin ester resin, a terpene phenol resin and a terpene resin, an anti-yellowing agent, an antioxidant, etc.

The constituent materials and compositions of the window bonding member 410 are not limited to those described above, and any other constituent materials or compositions of the adhesive material may be applied.

After the window bonding member 410 is disposed between the polarizing member 200 and the cover window 100, the window bonding member 410 may be cured via an ultraviolet (UV) curing process. The modulus of the window bonding member 410 may be increased after it is cured with ultraviolet rays, while the creep properties and penetration depth of the window bonding member 410 may be decreased after it is cured with ultraviolet rays.

The modulus of the window bonding member 410 may be approximately 0.61 Mpa or more. In addition, the creep properties of the window bonding member 410 may be approximately 70% or less. In addition, the penetration depth of the window bonding member 410 may be approximately 13 μm or less.

Figure 4:
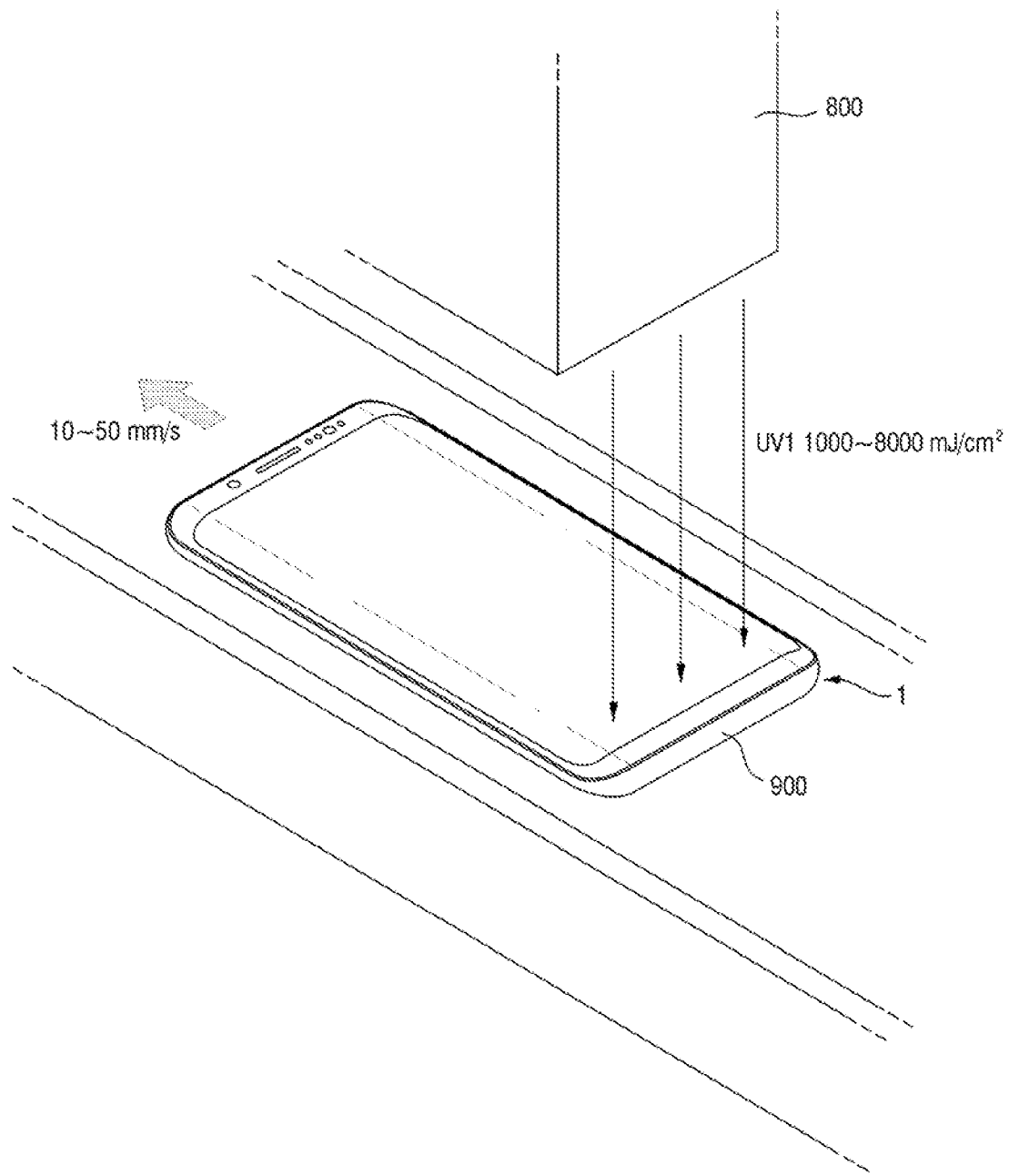
FIG. 4 is a perspective view showing ultraviolet curing of a window bonding member of a display device according to an exemplary embodiment of the present invention.
Figure 5:
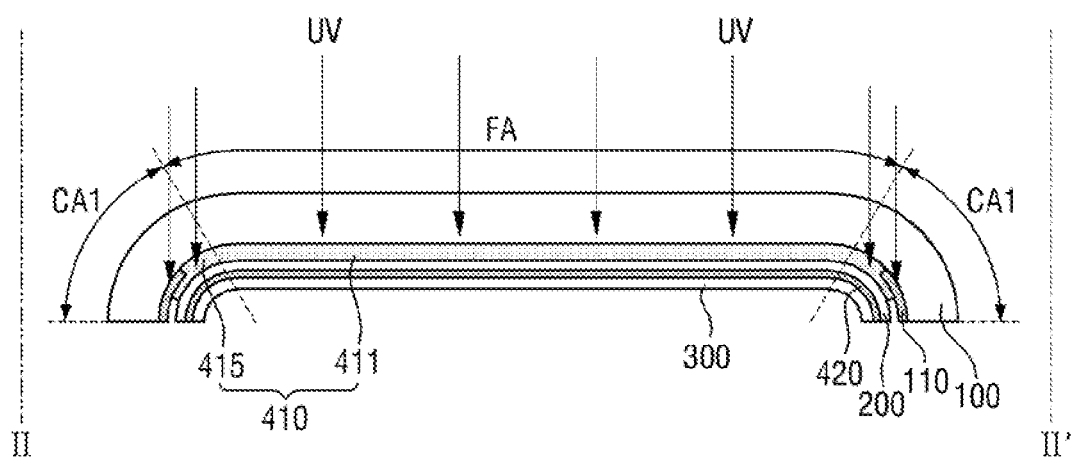
FIG. 5 is a cross-sectional view showing ultraviolet curing of a window bonding member of a display device according to an exemplary embodiment of the present invention.

FIG. 4 is a perspective view showing ultraviolet curing of a window bonding member of a display device according to an exemplary embodiment of the present invention. FIG. 5 is a cross-sectional view showing ultraviolet curing of a window bonding member of a display device according to an exemplary embodiment of the present invention.

Referring to FIGS. 4 and 5, in the display device 1 according to an exemplary embodiment of the present invention, a window bonding member 410 may be disposed on a polarizing member 200, a cover window 100 may be disposed on the window bonding member 410, and then an ultraviolet (UV) curing process may be carried out. As described above, the physical properties of the window bonding member 410 may be changed after the UV curing process.

The UV curing process may be carried out by an ultraviolet curing apparatus 800 irradiating ultraviolet (UV) onto the window bonding member 410.

As shown in FIG. 4, the ultraviolet curing apparatus 800 may irradiate ultraviolet rays onto the display device 1 while moving in the second direction (y-axis direction). The ultraviolet curing apparatus 800 may radiate ultraviolet rays onto the window bonding member 410 of the display device 1 while moving from the lower shorter side to the upper shorter side of the display device 1.

The accumulated amount of ultraviolet rays irradiated from the ultraviolet curing apparatus 800 onto the display device 1 may range from approximately 1,000 mJ/cm$^2$ to 8,000 mJ/cm$^2$. According to an exemplary embodiment of the present invention, the accumulated amount of ultraviolet rays may range from approximately 2,000 mJ/cm$^2$ to 8,000 mJ/cm$^2$.

The speed of the ultraviolet curing device 800 may range from approximately 10 mm/s to 50 mm/s. The ultraviolet curing device 800 may radiate ultraviolet rays onto the window bonding member 410 of the display device 1 while moving from the lower shorter side to the upper shorter side of the display device 1 at a speed within the above range.

It is, however, to be understood that the present invention is not limited thereto. The ultraviolet curing apparatus 800 may irradiate ultraviolet rays onto the display device 1 while moving in the first direction (x-axis direction). In other words, the ultraviolet curing apparatus 800 may irradiate ultraviolet rays onto the display device 1 while moving from the left longer side to the right longer side of the display device 1 or the other way.

The ultraviolet curing apparatus 800 may radiate ultraviolet rays (UV) toward the upper side of the display device 1. The angle formed by the path of the irradiated ultraviolet rays UV and the flat area FA of the display device 1 may be substantially a right angle. The ultraviolet rays UV irradiated onto the flat area FA pass through the cover window 100 and then may be incident on the window bonding member 410. The ultraviolet rays UV irradiated onto the part of the curved areas CA1 and CA2 where the light-blocking pattern 110 is not disposed may pass through the cover window 100 and then may be incident on the window bonding member 410. On the other hand, the ultraviolet rays UV irradiated onto the part of the curved areas CA1 and CA2 where the light-blocking pattern 110 is disposed may pass through the cover window 100 and the light-blocking pattern 110 and then may be incident on the window bonding member 410. As shown in FIG. 5, the ultraviolet rays UV irradiated onto the curved areas CA1 and CA2 where the light-blocking pattern 110 is disposed are reflected or absorbed by the light-blocking pattern 110, and thus, the amount of the light irradiated onto the window bonding member 410 may be reduced, compared to the amount of the ultraviolet rays UV irradiated onto the flat area FA or the part of the curved areas CA1 and CA2 where the light-blocking pattern 110 is not disposed. As a result, the second portions 415 of the window bonding member 410 disposed in the parts of the curved areas CA1 and CA2 where the light-blocking pattern 110 is disposed may have a smaller modulus than that of the first portion 411 and that of the second portions 415 disposed in the part of the curved portions CA1 and CA2 where the light-blocking pattern 1110 is not disposed.

Furthermore, the second portions 415 are bent in the thickness direction (z-axis direction) more than the first portion 411. In this case, the amount of the ultraviolet rays irradiated from the ultraviolet curing apparatus 800 reaching the second portions 415 may be smaller than that of the first portion 411. Thus, the modulus of the second portion 415 of the window bonding member 410 may be smaller than the modulus of the first portion 411 of the window bonding member 410.

If the modulus of the second portions 415 of the window bonding member 410 is less than a normal reference value, the coupling force between the cover window 100 and the second portions 415 of the window bonding member 410 in the curved areas CA1 and CA2 may be weakened, and thus, the cover window 100 and the second portions 415 in the curved areas CA1 and CA2 may be separated from each other. Furthermore, bubbles may be generated in the second portion 415 of the window bonding member 410.

In this regard, in the display device 1 according to an exemplary embodiment of the present invention, the modulus of the second portions 415 of the window bonding member 410 may be approximately 0.61 Mpa or more. In other words, the accumulated amount of ultraviolet rays and/or the speed of the ultraviolet curing apparatus 800 may be reduced so that the modulus of the second portions 415 of the window bonding member 410 is approximately 0.61 MPa or more. In order for the modulus of the second portions 415 of the window bonding member 410 to be approximately 0.61 Mpa or more, when the thickness of the thin film ranges from approximately 0.05 mm to 1 mm, the accumulated amount of ultraviolet rays may range from approximately 1,000 m/cm$^2$ to 8,000 mJ/cm$^2$, and the speed of the ultraviolet curing apparatus 800 may range from approximately 10 mm/s to 50 mm/s.

The modulus of the window bonding member 410 may be measured after it is included in the display device 1 and then removed. The modulus of such a thin adhesive layer may be measured by a nanoindentation tester such as Bio-indenter (available from Anton Paar GmbH) or nano indenter. In other words, the modulus of the thin adhesive layer may be measured according to the indenter evaluation method.

Typically, a rheometer used to measure the modulus of an adhesive material cannot be used for an adhesive layer having a thickness of 500 μm or less. The modulus may be measured from a bulk adhesive material or a stack of multiple adhesive layers having a thickness greater than 500 μm or 700 μm. However, the modulus measured from the bulk adhesive material or the multiple adhesive layers may be different from the modulus of the thin adhesive layer actually applied to the display device 1. In particular, the modulus of the adhesive material may vary during a heat treatment process for laminating multiple layers to form a stacked structure of the display device 1. In doing so, the modulus may be changed depending on different process variables. Therefore, the modulus of the bonding member applied in the display device 1 may not be found only by using the modulus measured from the bulk adhesive material. Thus, the actual modulus required by the display device 1 may not be accurately determined.

In contrast, the nanoindentation tester can be used for measuring the modulus of a thin film of 500 μm or less, and even a thin film of 1 μm. Therefore, the modulus of the bonding member 410 can be measured accurately by measuring the modulus from the thin film or by exposing or separating the window bonding member 410 from the display device 1 by reverse engineering. For example, each window bonding member 410 may be extracted by separating the layers using liquid nitrogen, and the modulus of the extracted window bonding member 410 may be measured using a nanoindentation tester. By controlling the actual modulus of the window bonding member 410 based on the values thus measured, it is possible to precisely manage adhesive properties of the window bonding member 410 of the display device 1. The adhesive properties may be managed by preventing separation between the cover window 100 and the polarizing member 200 and adjusting the restoring force and peeling force. For example, if the measured modulus exceeds the above-described appropriate range, it may be determined that the window bonding member 410 is defective. In this case, it is possible to maintain excellent adhesive properties of a normal product. Furthermore, by deriving the modulus required for fabricating each window bonding member 410 based on the measured value and adjusting it accordingly, it is possible to further reduce the percentage of defective products. The adhesive properties of the adhesive material may be controlled by process variables during the fabricating processes, such as the type of material, compounding ratio, heat treatment temperature or UV exposure, etc.

Creep properties, one of the adhesive properties, are generally proportional to the viscosity. The creep properties of the window bonding members 410 may lie in the range of 30% to 70%.

The creep properties of the second portions 415 of the window bonding member 410 may be greater than the creep properties of the first portion 411 of the window bonding member 410. Even though the creep properties of the first portion 411 and the second portions 415 are different from each other, the creep properties of the first portion 411 and the second portions 415 may lie in the range of 30% to 70%.

The creep properties may also be measured by a nanoindentation tester. The creep properties of the window bonding member 410 that is a thin film or is applied to and then separated from the display device 1 may lie in the above range of 30% to 70%.

Hereinafter, a method of measuring the modulus and creep properties by an indenter will be described.

Figure 6:
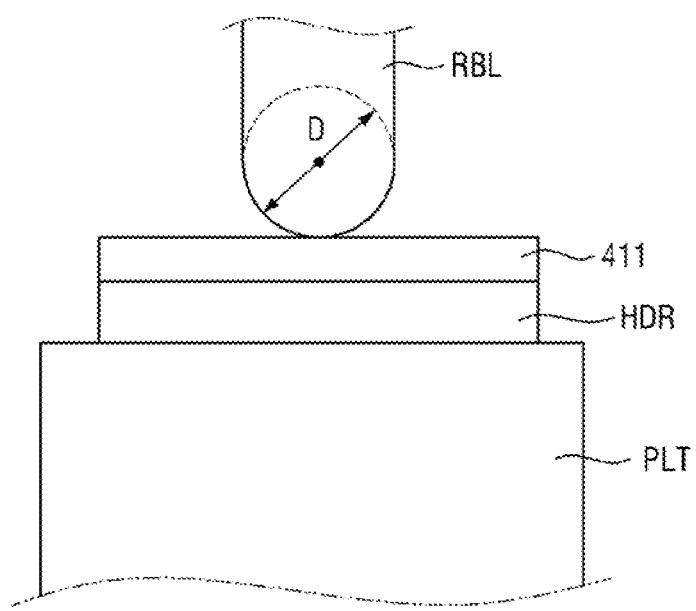
FIG. 6 is a schematic view showing measuring physical properties of a window bonding member by a Bio-indenter according to an exemplary embodiment of the present invention.

FIG. 6 is a schematic view showing a method of measuring modulus and creep properties of an adhesive layer by a Bio-indenter according to an exemplary embodiment of the present invention. FIG. 7 is a table showing measurement conditions for a Bio-indenter according to an exemplary embodiment of the present invention.

Referring to FIGS. 6 and 7, a Bio-indenter includes an indenter RBL. The shape of the indenter RBL may be a ball (ruby ball) or may include at least a part of a ball. The diameter (D) of the indenter RBL having a ball shape may be, but is not limited to, 1 mm.

In an exemplary embodiment of the present invention, the adhesive layer 411 (a first portion of the window bonding member 410) is cut into the size of 2 cm×2 cm as a sample. When a release film is attached to the adhesive layer 411, the release film is removed, and then the adhesive layer 411 is attached to a flat holder HDR. Subsequently, the flat holder HDR is placed on a plate PLT. Subsequently, the indenter RBL is pressed against the surface of the adhesive layer 411 with the force of the maximum load of 0.5 mN and is held for 120 seconds. The loading/unloading rate of the indenter RBL, e.g., the pressing rate, may be 3.0 mN/min. The penetration depth during such pressurization is measured. The indentation test by the indenter RBL of the Bio-indenter is carried out at a plurality of points on a single sample, e.g., fifteen points. The penetration depth may be expressed as the average value of the results of the plurality of tests.

The table in FIG. 7 lists items and corresponding measurement conditions. For example, the instrument may be an Anton Paar UNHT-BIO, a tip of the instrument may be a ruby ball having a 500 μm radius, a load of the instrument may be 0.5 mN, a load/unloading rate of the instrument may be 3 mN/min, a holding time of the instrument may be 120 sec, a Poisson's ratio of the instrument may be 0.3 and a Kelvin-Voight model element count of the instrument may be 2.

Figure 8:
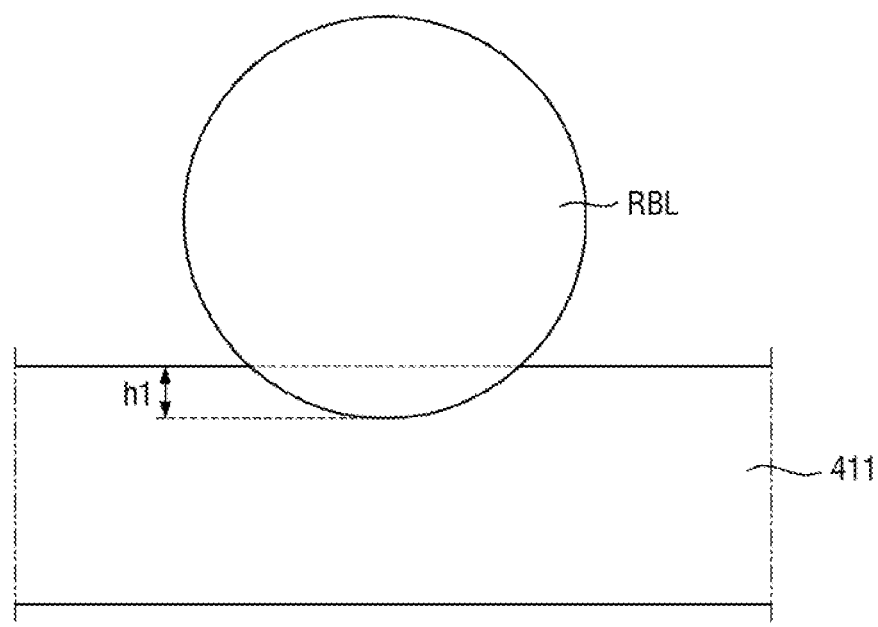
FIGS. 8 and 9 are cross-sectional views showing penetration depths of the first portion of the window bonding member by the Bio-indenter.
Figure 9:
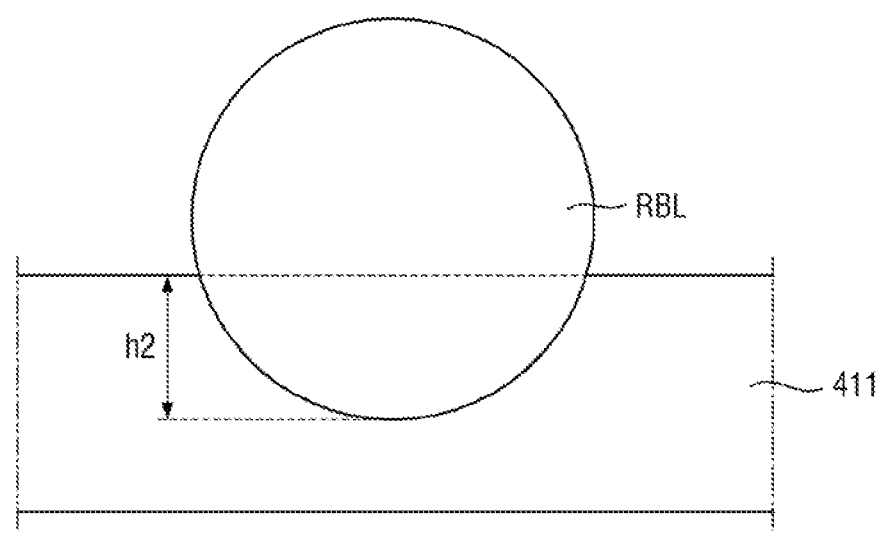
Figure 10:
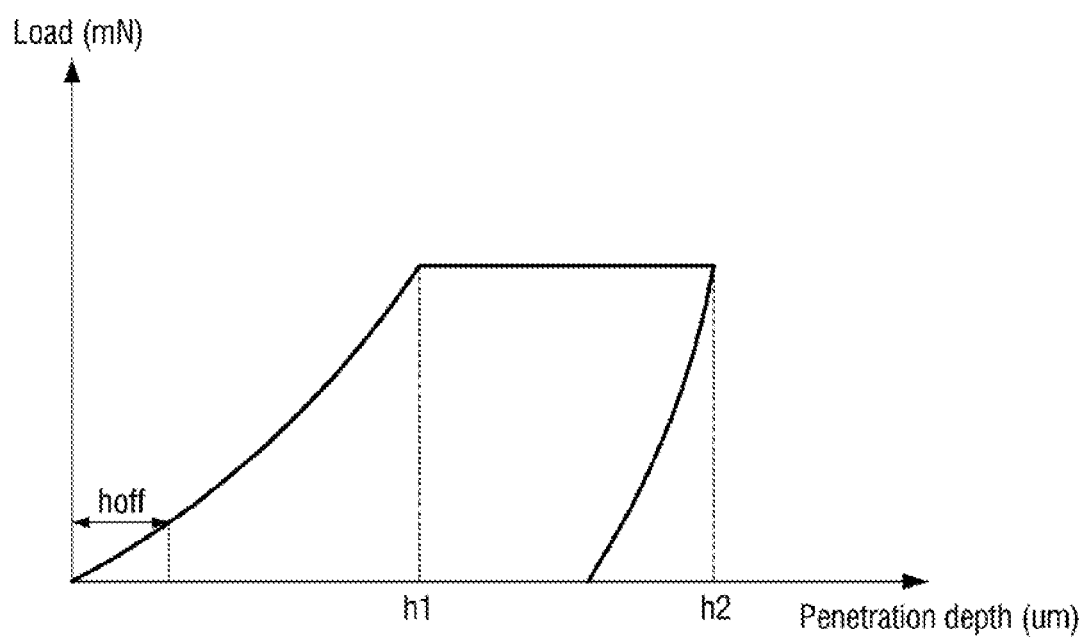
FIG. 10 is a graph showing the relationship between penetration depth and load.
Figure 11:
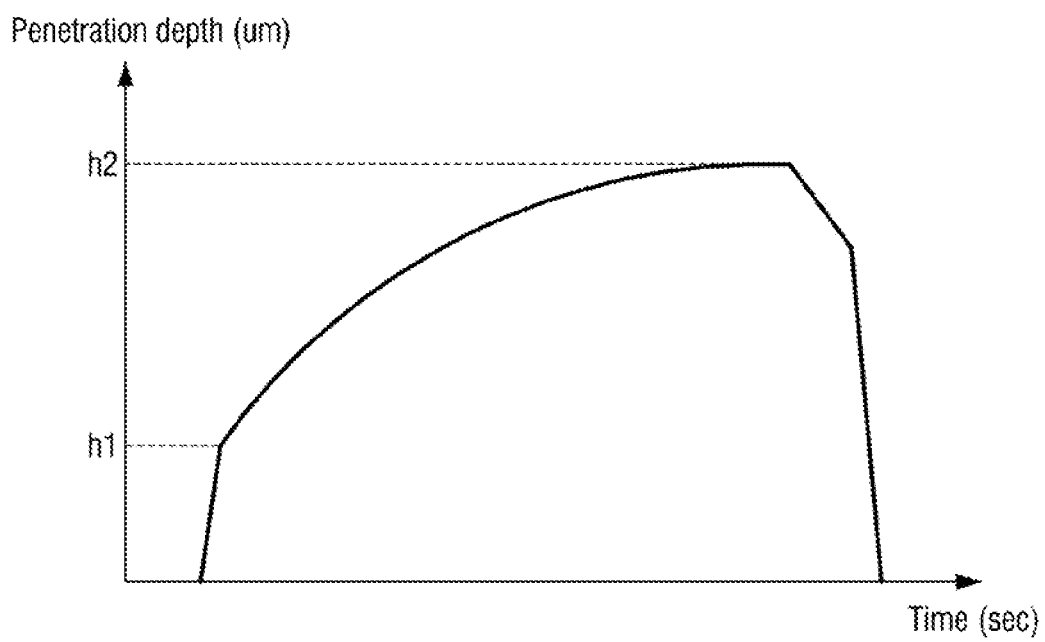
FIG. 11 is a graph showing penetration depth over time before and after a maximum load holding time.
Figure 12:
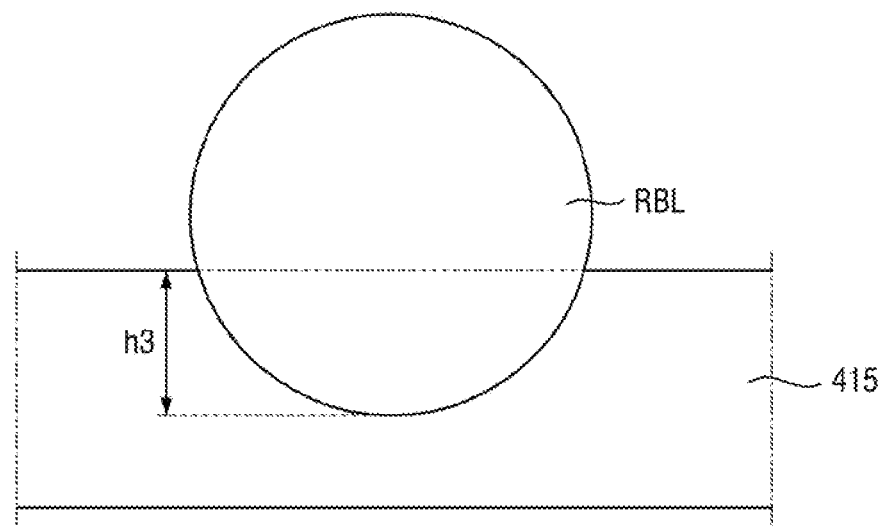
FIG. 12 is a cross-sectional view showing the penetration depth of the second portion of the window bonding member by a bio-indenter.

FIGS. 8 and 9 are cross-sectional views showing penetration depths of the first portion of the window bonding member by the Bio-indenter. FIG. 10 is a graph showing the relationship between penetration depth and load. FIG. 11 is a graph showing penetration depth over time before and after a maximum load holding time. FIG. 12 is a cross-sectional view showing the penetration depth of the second portion of the window bonding member by a Bio-indenter.

Referring to FIGS. 8 to 11, the penetration depth of the indenter RBL increases with the indentation load of the indenter RBL. The smaller the modulus of an adhesive layer is, the more it is deformed by stress. Therefore, the penetration depth for a given indentation load increases as the modulus decreases in the graph of FIG. 10. The penetration depth continues to increase while the indenter RBL is held at the maximum load due to the viscosity of the adhesive layer 411. The larger the creep properties are, the greater the penetration depth is during the maximum load holding time. The rate of increase in the penetration depth during the maximum load holding time gradually decreases over time (e.g., the slope decreases in the graph of FIG. 11). The penetration depth may not increase beyond a certain time point and may be held at a certain value if the holding time is long. When the indenter RBL is unloaded, the penetration depth decreases. The larger the restoring force is, the smaller the penetration depth after the indenter RBL is unloaded.

According to an exemplary embodiment of the present invention, the penetration depth (the depth h2 when the maximum load is held in FIG. 9) of the first portion 411 of the window bonding member 410 of the display device 1 may be approximately 13 μm or less. The penetration depth (the depth h3 when the maximum load is held in FIG. 12) of the second portions 415 of the window bonding member 410 may be smaller than the penetration depth of the first portion 411 of the window bonding member 410. In other words, the depth h2 may be deeper than the depth h3. Even though the penetration depths of the first portion 411 and the second portions 415 are different from each other, the penetration depths of the first portion 411 and the second portions 415 may be equal to or less than approximately 13 μm. In FIG. 8, h1 may refer to a penetration depth that is formed at less than the maximum load.

Once the penetration depth is measured as described above, the modulus E* may be calculated by Equation 1 below:

$$P = \frac{4}{3} E^* \sqrt{R} \sqrt{h^3} \qquad \text{[Equation 1]}$$

where P denotes the maximum load, R denotes the radius of the indenter RBL, and h denotes the penetration depth. The penetration depth denotes the depth h3 at the maximum load. Incidentally, when the Bio-indenter has a predetermined offset depth $h_{offset}$, the penetration depth of Equation 1 can be expressed as the depth h3 at the maximum load measured by the Bio-indenter minus the offset depth $h_{offset}$. The offset depth $h_{offset}$ refers to the distance that is recognized as being penetrated due to the van der Waals forces at the surface of the adhesive layer 411, even though it is not actually when the Bio-indenter measures the penetration depth and the indenter RBL is close thereto. Therefore, the actual penetration depth can be calculated by subtracting the offset depth $h_{offset}$ from the penetration depth measured by the Bio-indenter. To reduce the measurement error due to the offset depth $h_{offset}$, the modulus may be calculated by designating the loading slope to be in the range from 30 to 98% of the maximum load (0.15 to 0.49 mN) in the penetration depth-load graph. A more accurate modulus E can be derived from the modulus E* by Equation 2 below:

$$E^* = \frac{E}{(1-V)} \qquad \text{[Equation 2]}$$

In addition, the creep properties (CIT) can be calculated by Equation 3 below:

$$C_{IT} = \frac{h_2 - h_1}{h_1} \cdot 100 \qquad \text{[Equation 3]}$$

In this manner, each window bonding member 410 of the display device 1 can have an appropriate penetration depth, and the modulus and creep properties derived therefrom. Accordingly, it is possible to precisely manage the adhesive properties of the bonding member 410 of the display device 1, such as preventing separation between the cover window 100 and the polarizing member 200 and adjusting the restoring force and peeling force.

Hereinafter, other exemplary embodiments of the present invention will be described. In the following description, the same or similar elements may be denoted by the same or similar reference numerals, and thus, redundant descriptions will be omitted or briefly described.

Figure 13:
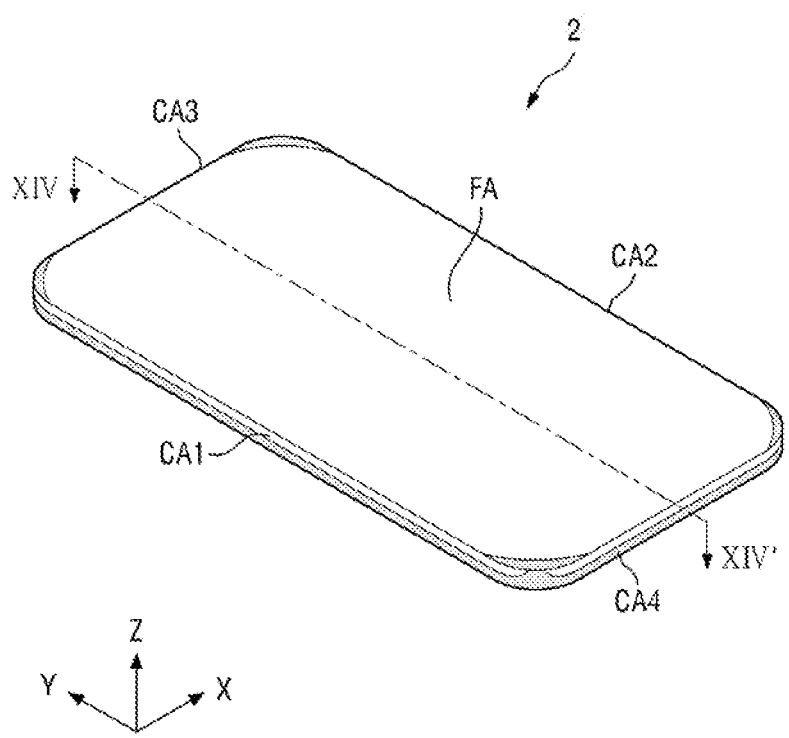
FIG. 13 is a perspective view of a display device according to another exemplary embodiment of the present invention.
Figure 14:
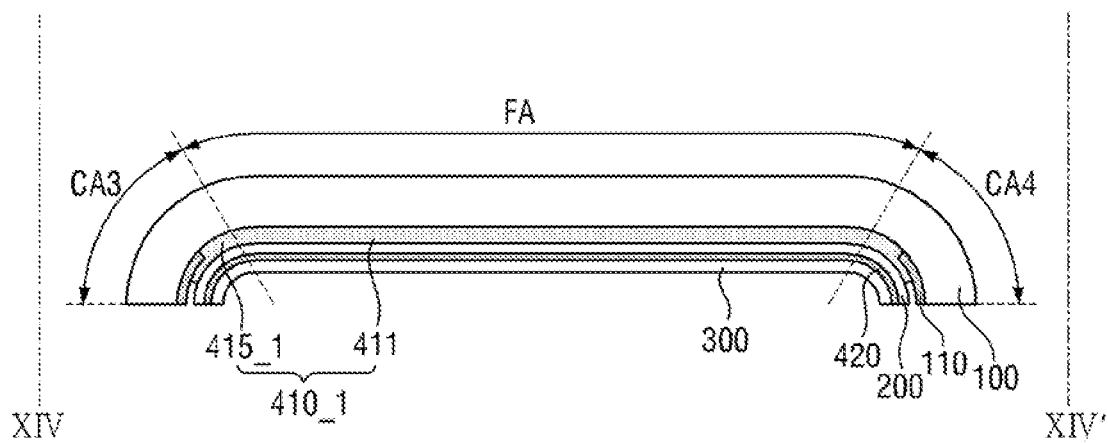
FIG. 14 is a cross-sectional view taken along line XIV-XIV' of FIG. 13.

FIG. 13 is a perspective view of a display device according to another exemplary embodiment of the present invention. FIG. 14 is a cross-sectional view taken along line XIV-XIV' of FIG. 13.

Referring to FIGS. 13 and 14, a display device 2 according to the present embodiment is different from the display device 1 of FIGS. 1 and 2 in that a third curved area CA3 and a fourth curved area CA4 are further included.

More specifically, the display device 2 according to the present embodiment may further include a third curved area CA3 and a fourth curved area CA4.

The third curved area CA3 may be located on the upper shorter side of the display device 2, and the fourth curved area CA4 may be located on the lower shorter side of the display device 2.

The curved areas CA3 and CA4 may be extended from upper and lower sides of the flat area FA of the display device 2, respectively. The curved areas CA3 and CA4 may be curved surfaces. It is, however, to be understood that the present invention is not limited thereto. The curved areas CA3 and CA4 may be flat surfaces. When the curved areas CA3 and CA4 are flat, the angle between the flat area FA and the curved areas CA3 and CA4 may be obtuse. When the curved areas CA3 and CA4 are curved surfaces, the curved areas CA3 and CA4 may have a constant curvature or varying curvatures.

The cover window 100 may be disposed on the flat area FA and the curved areas CA1, CA2, CA3 and CA4.

A window bonding member 410_1 may be disposed on the flat area FA and parts of the curved areas CA1, CA2, CA3 and CA4.

The window bonding member 410_1 may be indented inwardly from the cover window 100 and the polarizing member 200. In other words, the window bonding member 410_1 may expose the surface of the polarizing member 200 facing the cover window 100 in the curved areas CA1 and CA2. It is, however, to be understood that the present invention is not limited thereto. The window bonding member 4101 may not expose the surface of the polarizing member 200 facing the cover window 100 but may completely cover it in the curved areas CA1 and CA2. The window bonding member 410_1 may be optically transparent.

The window bonding member 410_1 according to the present embodiment may include a first portion 411 disposed on the flat area FA, and second portions 4151 disposed on the curved areas CA1, CA2, CA3 and CA4.

The physical properties of the second portion 415_1 of the window bonding member 410_1 may be substantially the same as those of the second portion 415 of the window bonding member 410 described above with reference to FIG. 2. Therefore, redundant description will be omitted.

According to an exemplary embodiment of the present invention, it is possible to prevent a cover window from being separated from a polarizing member due to a weak coupling force by a window bonding member in curved areas and to suppress bubbles in the window bonding member.

Although exemplary embodiments of the present invention have been described with reference to the accompanying drawings, those skilled in the art would understand that various modifications and alterations may be made thereto without departing from the technical idea or features of the present invention.

What is claimed is:

1. A display device, comprising:
a display panel;
a polarizing member overlapping the display panel;
a cover window overlapping the polarizing member;
a window bonding member disposed between the polarizing member and the cover window, and
a light-blocking pattern disposed directly on a surface of the cover window that faces the window bonding member,
wherein the display device comprises a flat area, a first curved area located on a first side of the flat area, and a second curved area located on a second side of the flat area,
wherein the light-blocking pattern is disposed in the first curved area and the second curved area, and
wherein the window bonding member exposes a surface of the polarizing member facing the light blocking pattern in the first and second curved areas and a surface of the light blocking pattern facing the polarizing member in the first and second curved areas such that a space exists directly between the exposed surface of the polarizing member and the exposed surface of the light blocking pattern in each of the first and second curved areas.

2. The display device of claim 1, wherein a modulus of elasticity of the window bonding member is equal to or greater than approximately 0.61 MPa, and wherein creep properties of the window bonding member are approximately 70%.

3. The display device of claim 2, wherein the window bonding member is a thin film having a thickness of 0.05 mm to 1 mm, and wherein the modulus of elasticity and the creep properties of the window bonding member are measured from the thin film.

4. The display device of claim 2, wherein the modulus of elasticity and the creep properties of the window bonding member are measured from the window bonding member separated from the display device by using an indentation tester.

5. The display device of claim 2, wherein the window bonding member comprises a first portion disposed in the flat area, and second portions disposed in the first curved area and the second curved area, and
wherein a penetration depth of the first portion is smaller than a penetration depth of each of the second portions.

6. The display device of claim 5, wherein a modulus of elasticity of the first portion is greater than a modulus of elasticity of each of the second portions, and creep properties of the first portion are smaller than creep properties of each of the second portions.

7. The display device of claim 2, wherein the window bonding member is ultraviolet ray (UV) cured.

8. The display device of claim 7, wherein the window bonding member is disposed between the polarizing member and the cover window and then UV cured.

9. A display device comprising a flat area, a first curved area located on a first side of the flat area and a second curved area located on a second side of the flat area,
wherein the display device comprises:
a display panel;
a polarizing member overlapping the display panel;
a cover window overlapping the polarizing member;
a window bonding member disposed between the polarizing member and the cover window; and
a light blocking pattern disposed between the window bonding member and the polarizing member,
wherein a thickness of the window bonding member between the light blocking pattern and the polarizing member is less than a thickness of the window bonding member between the cover window and the polarizing member,
wherein a modulus of elasticity of the window bonding member is equal to or greater than approximately 0.61 MPa, and
wherein the window bonding member exposes a surface of the polarizing member facing the light blocking pattern in at least one of the first and second curved areas and a surface of the light blocking pattern facing the polarizing member in at least one of the first and second curved areas such that an empty space exists directly between the exposed surface of the polarizing member and the exposed surface of the light blocking pattern.

10. The display device of claim 9, wherein the window bonding member comprises a first portion disposed on the flat area, and second portions disposed on the first curved area and the second curved area, and wherein a modulus of elasticity of the first portion is larger than a modulus of elasticity of each of the second portions.

11. The display device of claim 10, wherein creep properties of the window bonding member are approximately 70%, and creep properties of the first portion is smaller than creep properties of each of the second portions.

12. The display device of claim 11, wherein a penetration depth of the window bonding member is equal to or less than 13 μm, and wherein a penetration depth of the first portion is smaller than a penetration depth of each of the second portions.

13. The display device of claim 12, wherein the window bonding member is a thin film having a thickness of 0.05 mm to 1 mm, and wherein the modulus of elasticity of the window bonding member and the creep properties of the window bonding member are measured from the thin film.

14. The display device of claim 12, wherein the modulus of elasticity of the window bonding member and the creep properties of the window bonding member are measured from the window bonding member separated from the display device.

15. A display device comprising a flat area, a first curved area located on a first side of the flat area and a second curved area located on a second side of the flat area,
wherein the display device comprises:
a display panel;
a polarizing member disposed on the display panel;
a cover window disposed on the polarizing member;
a window bonding member disposed between the polarizing member and the cover window; and
a light blocking pattern disposed on the cover window,
wherein the window bonding member comprises a first portion disposed on the flat area and second portions disposed on the first curved area and the second curved area,
wherein a modulus of elasticity of the first portion is equal to or greater than approximately 0.61 MPa and a modulus of elasticity of each of the second portions is equal to or greater than approximately 0.61 MPa, and
wherein the window bonding member exposes a surface of the polarizing member facing the light blocking pattern in the first and second curved areas and a surface of the light blocking pattern facing the polarizing member in the first and second curved areas such that an empty space exists directly between the exposed surface of the polarizing member and the exposed surface of the light blocking pattern in each of the first and second curved areas.

16. The display device of claim 15, wherein creep properties of the first portion are approximately 70% and creep deformation characteristics of each of the second portions are approximately 70%, and wherein the creep properties of the first portion are smaller than the creep properties of each of the second portions.

17. The display device of claim 16, wherein a penetration depth of the first portion is equal to or less than approximately 13 μm and a penetration depth of each of the second portions is equal to or less than approximately 13 μm, wherein the penetration depths of the first portion and the second portions are measured by an indentation tester, and the penetration depth of the first portion is smaller than the penetration depth of each of the second portions.

* * * * *